United States Patent [19]

Dufour

[11] Patent Number: 4,817,097

[45] Date of Patent: Mar. 28, 1989

[54] METHOD OF AND DEVICE FOR PULSE-MODE DRIVING A SEMI-CONDUCTOR LASER

[75] Inventor: René Dufour, Eindhoven, Netherlands

[73] Assignee: U.S. Philips Corp., New York, N.Y.

[21] Appl. No.: 59,285

[22] Filed: Jun. 8, 1987

[30] Foreign Application Priority Data

Sep. 12, 1986 [NL] Netherlands ............... 8602303

[51] Int. Cl.⁴ ............... H01S 3/10; H01S 3/00; H01S 3/13
[52] U.S. Cl. ............... 372/25; 372/29; 372/30; 372/31; 372/38
[58] Field of Search ............... 372/38, 29, 30, 25, 372/3

[56] References Cited

U.S. PATENT DOCUMENTS

| | | | |
|---|---|---|---|
| 4,488,305 | 12/1984 | Claverie et al. | 372/38 |
| 4,577,320 | 3/1986 | Yoshikawa et al. | 372/38 |
| 4,635,265 | 1/1987 | O'Harra, II | 372/38 |

Primary Examiner—William L. Sikes
Assistant Examiner—Georgia Y. Epps
Attorney, Agent, or Firm—Bernard Franzblau

[57] ABSTRACT

A method of and a device for pulse-mode driving a semiconductor laser in which the semiconductor laser (60) is operated by first driving the laser into the LED region with a pedestal current pulse from a first current source (41) and by superposing thereon an information current pulse from a second current source (51) after current stabilization. Due to this two-stage drive, switching transients can be reduced so that shorter pulses are possible and unnecessary power dissipation between the information pulses is avoided, which extends to the lifetime of the semi-conductor laser.

12 Claims, 3 Drawing Sheets

METHOD OF AND DEVICE FOR PULSE-MODE DRIVING A SEMI-CONDUCTOR LASER

BACKGROUND OF THE INVENTION

This invention relates to a method of pulse-mode driving of a semiconductor laser in which a pedestal current which is smaller than the laser-threshold current and an information current pulse are passed through the laser for obtaining a laser pulse, the sum of the pedesal current and the information current being larger than the laser-threshold current. The invention also relates to a driving device for a semiconductor laser and to an optical writing apparatus provided with a semiconductor laser and such a driving device. Laser-threshold current is understood to mean the minimum current through the laser at which the radiation is predominantly emitted as laser radiation. Within the scope of the present invention information current is understood to mean an electrical current which is passed through the laser in order to generate a laser pulse which corresponds to a unit of information to be recorded.

The said method and devices can be used for recording information in optical record carriers. For example, data originating from an electronic computer or to be applied to such a computer can be stored on these record carriers. Also audio or video programmes may be recorded by a user himself. Examples of such record carriers are known under the names "Digital Recording" or "DOR"-rcord, "Compact Disc" or "CD" and "Laservision"-records, respectively.

In optical record carriers the information is coded in information areas which are generally arranged in tracks and alternate in the track direction with intermediate areas, which information areaas are optically distinct from the intermediate areas and the lands between the information tracks. The information is stored in these tracks in the length and/or the frequency of the information areas and the intermediate areas. The information is recorded by scanning the radiation-sensitive surface of the record carrier by means of a writing beam focused to a radiation spot which is switched in intensity in accordance with the information to be recorded, the intensity variations causing local changes in the surface.

The developments in the field of optically inscribable record carriers increasingly move in the direction of higher signal frequencies. For the write beam this means that the duration of the radiation pulses with which the information areas are formed becomes shorter. However, since the quantity of energy which is required to form an information area remains substantially equal or even increases, the power of the laser pulse must increase. The semiconductor laser will thus have to be driven with shorter lasting and stronger current pulses and preferably also with a larger edge steepness. Upon driving a semiconductor laser with such current pulses switching transients caused, for example, by parasitic capacitances and inductance in the wiring and electro-magnetic radiation effects start to play a role.

The effect of the switching transients can be reduced by continuously passing a d.c.-current or pedestal current, which is slightly smaller than the laser-threshold current, through the semiconductor laser. A laser pulse can then be generated by superposing an information current pulse on the d.c.-current, which pulse has such an intesity that the total current through the laser is larger than the laser-threshold current. Such a laser drive is described in European Patent Specification No. 0,053,974. However, this method has the drawback that due to the d.c.-current a considerable dissipation occurs in the laser in the period between two pulses so that the lifetime of the laser is detrimentally influenced. The problem cited above also occurs in other uses in which a semiconductor laser is to be switched rapidly.

SUMMARY OF THE INVENTION

It is an object of the invention to provide a method of driving a semiconductor laser which maintains the advantage of the use of a pedestal current while the dissipation in the period between two information current pulses is limited as much as possible.

To this end the method according to the invention is characterized in that the pedestal current is a pulsed current and in that a pedestal current pulse is switched on prior to an information current pulse and is switched off at the earliest at the end of the information current pulse. The invention is based on the recognition that for optical recording of information it is sufficient that the pedestal current is stabilized during the information current pulse and that it is thus not necessary to maintain the d.c.-current through the semiconductor laser between the information pulses. Consequently, the pedestal current can then be switched off so that only little or no dissipation occurs in the semiconductor laser between the information current pulses. Since the length of an information pulse may be significantly shorter than the duration between two pulses when recording information in an optical record carrier, this measure may result in a considerably longer lifetime of the laser.

The method according to the invention may be further characterized in that the pedestal current pulse is switched on and/or switched off gradually. By causing the pedestal current at the commencement of the pedestal current pulse to increase gradually and by reducing it gradually to zero at the end of the pulse, switching transients can be substantially avoided.

The invention also relates to a driving device for a semiconductor laser comprising a first and a second switchable current source which can be arranged in parallel, the first current source supplying a pedestal current which is smaller than the laser-threshold current and the second current source supplying information current pulses, the sum of the pedestal current and of the information current being larger than the laser-threshold current. A device of this type is described in the said European Patent Specification No. 0,053,974.

According to the invention a device of this type is characterized in that the driving device comprises a first and a second pulse shaper for generating a first and a second switching pulse in order to switch the first and the second current source, respectively, the commencement of the second switching pulse being delayed with respect to the commencement of the first switching pulse and the length of the first switching pulse being at least equal to the sum of the length of the second switching pulse and the length of the time interval between the commencement of the two switching pulses.

The driving device according to the invention may be further characterized in that the first current source can be switched on gradually. By causing the pedestal current to increase gradually from zero to its maximum value, turn-on transients can be substantially avoided.

The driving device according to the invention may be further characterized in that the first current source can be switched off gradually. This makes it possible to suppress turn-off transients.

An embodiment of the driving device according to the invention is characterized in that at least one current source is a capacitor. A capacitor having a sufficient capacitance can be switched rapidly and in between the pulses it can be recharged from a constantly connected supply.

The invention also relates to a laser-writing apparatus comprising a semiconductor laser and a driving device therefor, an optical system for focusing laser radiation generated by the semiconductor laser to a radiation spot on the radiation-sensitive surface of an optical record carrier and means to move the radiation spot and the radiation-sensitive surface with respect to each other. A laser-writing apparatus according to the invention is characterized in that the driving device is formed in accordance with a method as described hereinbefore.

BRIEF DESCRIPTION OF THE DRAWINGS

The invention will now be described in greater detail by way of example with reference to the accompanying drawings in which.

DESCRIPTION OF THE PREFERRED EMBODIMENTS

Figure 1:
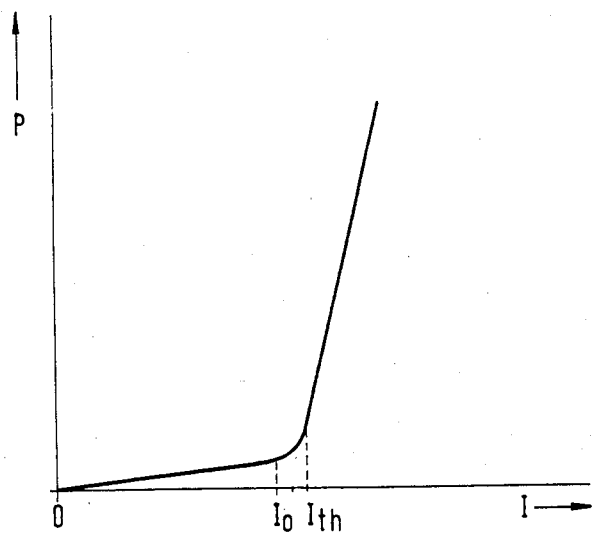
FIG. 1 shows graphically the relationship between the optical power generated in the laser and the current intensity.

In FIG. 1 the radiation intensity P emitted by the semiconductor laser is plotted as a function of the electric current I passed through the laser. This Figure shows that only above a given current intensity, the laser-threshold current $I_{th}$, will a considerable portion of the radiation emitted by the semiconductor laser be laser radiation. Below the slightly lower current intensity $I_o$ there is no laser radiation generated at all. This region is referred to as the LED region, in view of the radiation effect occurring.

Figure 2:
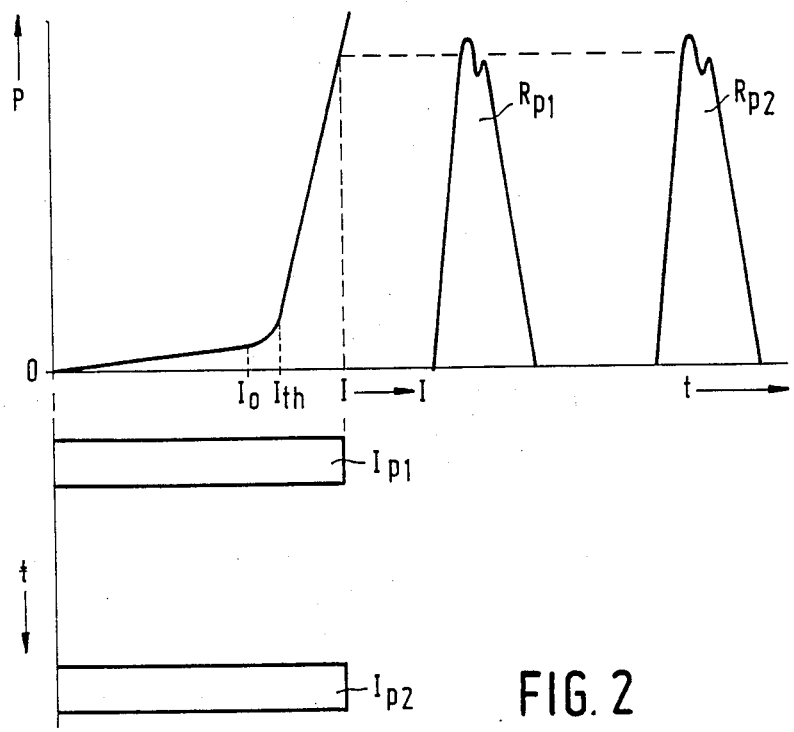
FIG. 2 illustrates a known method of driving a semiconductor laser.

FIG. 2 shows the drive mode which has hitherto been used frequently for a semiconductor laser. The top left portion of the Figure corresponds to FIG. 1. The bottom left portion shows the time variation of the current through the laser with the time axis being the vertical axis. At the current pulses $I_{p1}$ and $I_{p2}$ shown, the current is brought in one step from zero to the information current intensity and thereafter it is switched to zero again in one step. Due to these great changes in current intensity all kinds of undesirable sidephenomena are provoked which are caused by parasitic capacitances and inductance of the wiring. These effects generate a distortion and stretching of the laser pulse, as is illustrated in the right-hand half of the Figure in which the pulses $R_{p1}$ and $R_{p2}$ show the power emitted as radiation as a function of time. It is when very short pulses are generated that this phenomenon is unwanted because the desired intensity cannot be realized or cannot be realized long enough.

Figure 3:
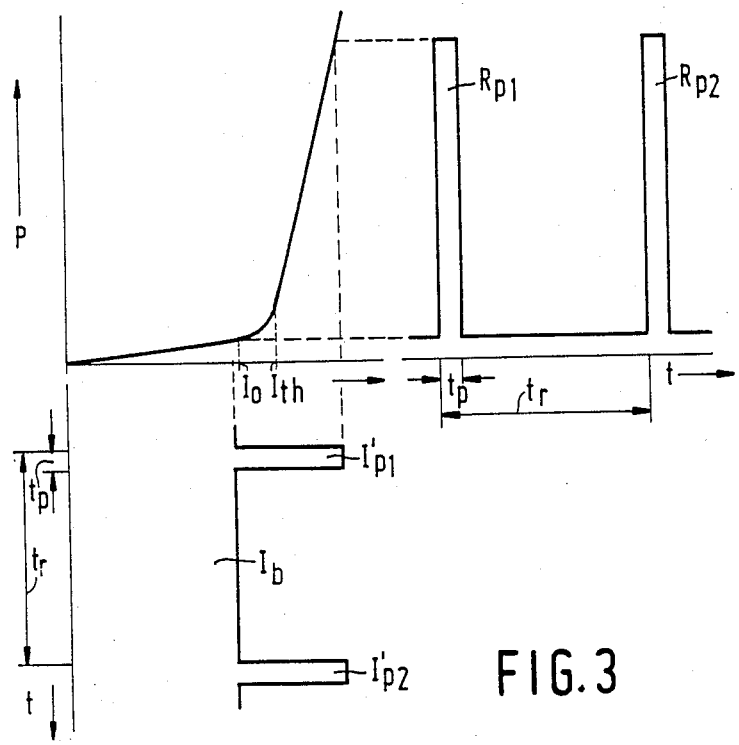
FIG. 3 shows a further known method.

FIG. 3 also shows a known alternative of this method in which a steep rising edge and a high intensity can be achieved. The lay-out of this Figure is the same as that of FIG. 2. As is shown in the bottom-left part the current between the pulses is not reduced to zero but to a value $I_b$ which is below the laser-threshold current $I_{th}$. A value in the high LED region is preferably used, hence slightly lower than $I_o$. As is shown in the right-hand part of the Figure steeper edges are realized therewith so that, also for short pulses, the radiation pulses $R_{p1}$ and $R_{p2}$ are square-shaped. However, a power dissipation in the semiconductor takes place between the pulses, which dissipation leads to a reduction in the lifetime of the laser. At the current intensities used the power dissipation is approximately linearly dependent on the current intensity. Thus, the horizontal axis in the Figure may also represent the dissipated power. Since, in a typical use as a writing laser in an optical record carrier, the pulse duration $t_p$ is only 5 to 10% of the repetition period $t_r$, this dissipation cannot be ignored. As described in British Patent Specification No. 2,118,352 the pulse duration is shorter than the repetition period because the distance over which the radiation spot on the surface of the record carrier is moved during the duration of the pulse is much smaller than the diameter of the radiation spot. A typical value of the pulse duration is 20 ns, which implies a distance of 0.1 μm at a scanning rate of 5 m/s, and which is thus much smaller than the spot diameter of 1 μm. At a pedestal current of 50 mA and a voltage drop across the semiconductor laser of 1.6 V between the pulses, a power of 80 mW is generated. During a pulse, for example, the voltage drop is 1.7 V and the current is 100 mA, which corresponds to a power of 170 mW. If the ratio between pulse duration and repetition period is 1:10, this means that more than four times as much energy is dissipated between the pulses as during the pulses.

Figure 4:
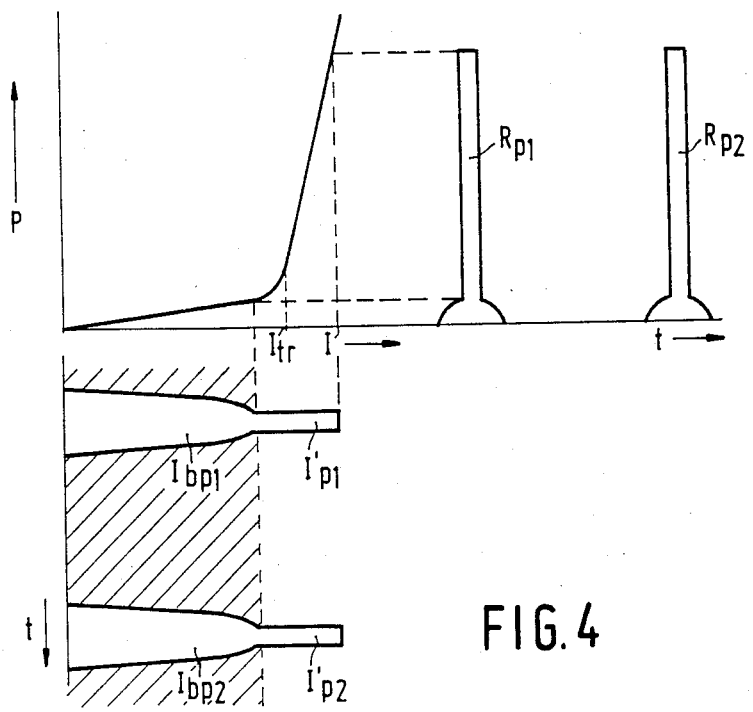
FIG. 4 shows diagrammatically the method according to the invention.

As is illustrated in FIG. 4, this unwanted dissipation can be largely obviated according to the invention by switching off the pedestal current during the greater part of the duration between two information current pulses so that the pedestal current also is a pulsed current in which the pedestal current pulses $I_{bp1}$ and $I_{bp2}$ overlap the information current pulses $I'_{p1}$ and $I'_{p2}$. The exact duration and shape of the rising edge of the pedestal current pulse is of little importance provided that the current intensity is stabilized at the instant when the information current pulse is passed through the laser. Also the shape of the falling edge of the pedestal current pulse is only of secondary importance. in the case of equal current and voltage values as indicated in the example above and further assuming that there is a linear increase and decrease of the pedestal current pulse and a turn-on and turn-off time of the pedestal current pulse which is equal to the pulse duration itself, the ratio between dissipated energy between the pulses in and during the information current pulses is 8:17. The quantity of energy which is dissipated between the pulses is thus approximately half the quantity generated during the pulses and in the case of equal pulse intensity approximately one eighth of the dissipation between the pulses without the use of the invention. This difference is indicated by a shaded area in FIG. 4.

Figure 5:
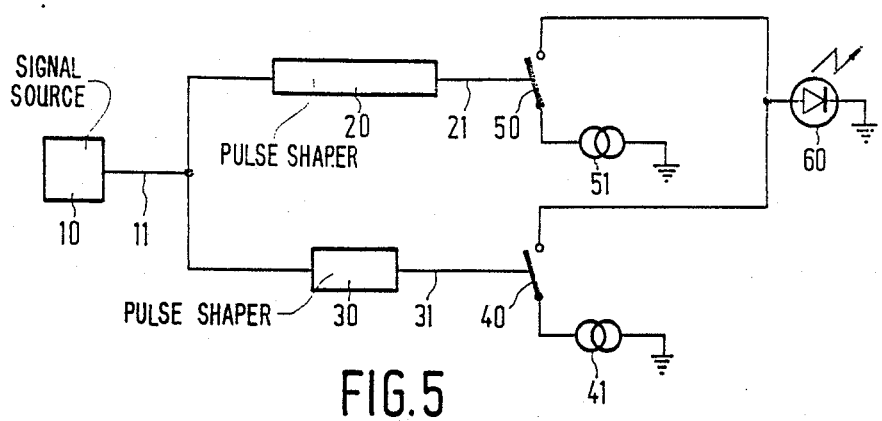
FIG. 5 shows diagrammatically a device for performing the method according the the invention.

FIG. 5 shows diagrammatically a device for performing the above-mentioned method. The reference numeral 10 denotes diagrammatically a signal source which supplies a signal to be written in the form of a series of pulses to the driving device. This signal source is, for example, an input-output channel of a digital computer or an analog-to-digital converter which converts an analog audio or video signal into a series of pulses. The output of the signal source 10 is connected via the connection 11 to the inputs of two pulse shapers 20 and 20. These convert the pulses originating from the signal source 10 into switching pulses for the switches 40 and 50 which are connected via the connections 21 and 31 to the pulse shapers. The commencement of the switching pulse generated by the pulse shaper 20 is delayed with respect to the pulse supplied by the shaper 30. This delay is sufficiently large to cause the pedestal current, which starts flowing after closing switch 40, to stabilize before switch 50 is closed. The length of the pulse supplied by shaper 30 is at least equal to the sum of the length of the said delay and the length of the switching pulse supplied by shaper 20.

A pulse originating from the signal source 10 thus first causes the switch 40 to close via shaper 30 so that a pedestal current originating from the pedestal current source 41 flows through the semiconductor laser 60, and subsequently the switch 50 closes for the duration of the information current pulse so that the total current through the semiconductor laser exceeds the laser-threshold current and hence a laser pulse is emitted. Finally the switch 40 is opened simultaneously with or shortly after opening the switch 50 so that the total current through the laser 60 decreases to zero.

Figure 6:
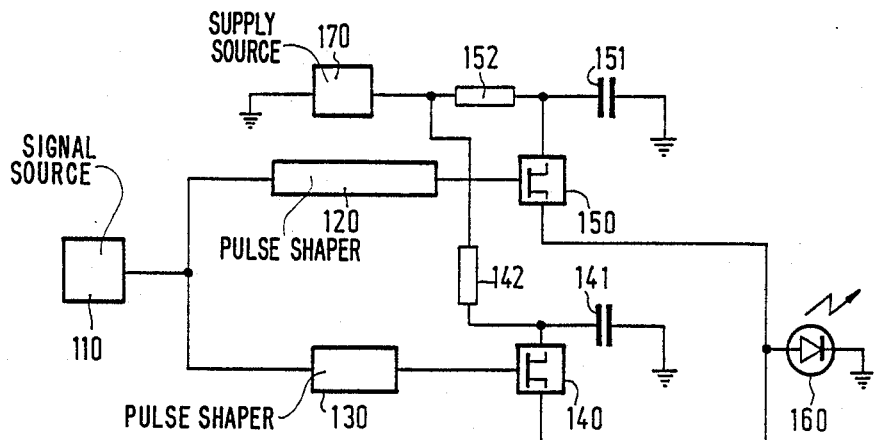
FIG. 6 shows a preferred embodiment of a driving device according to the invention.

FIG. 6 shows diagrammatically a slightly different embodiment of a driving device according to the invention. The signal source 110 and the pulse shaper 120 are comparable with the elements 10 and 20 described with reference to FIG. 5. The switches 140 and 150 are in the form of transistors, for example FET's, and the pulse shaper 130 is formed in such a way that the pulses originating therefrom have gradually rising and falling edges. The current sources 141 and 151 are capacitors which are charged from a supply source 170 in the interval between two pulses via the resistors 142 and 152. When a laser pulse is generated a portion of the charge present in the capacitors is used for the current through the semiconductor laser 160. In order to inhibit parasitic capacitances, inductance and electromagnetic radiation effects, the current sources, the switches and the semiconductor laser are preferably placed as close as possible together so that the wiring is as short as possible.

Figure 7:
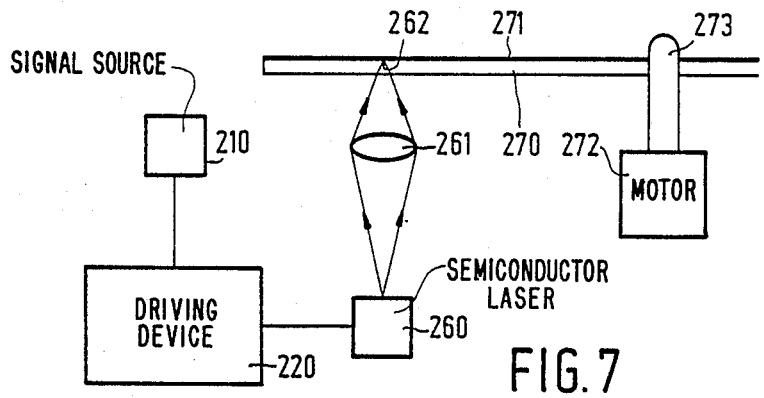
FIG. 7 shows a laser-writing apparatus according to the invention.

FIG. 7 shows diagrammatically a laser-writing apparatus in which a driving device according to the invention is incorporated. A disc-shaped plate 270 which is provided with a radiation-inscribable layer 271 is brought to a rotating movement about a shaft 273 by a motor 272. A semiconductor laser 260 emits laser pulses which are focused by means of a focusing system, diagrammatically shown by a lens 261, to a radiation spot 262 on the radiation-sensitive layer 271. Since the plate 270 rotates about the shaft 273, a track of optically readable areas will be produced in the radiation-sensitive layer at the area where the radiation spot has acted on the radiation-sensitive layer, alternating with intermediate areas which correspond to instants at which the semiconductor laser did not emit any laser radiation. According to the invention the semiconductor laser 260 is driven by a driving device 220 which passes both pedestal current pulses and information current pulses superposed thereon through the laser. The driving device generates these pulses in response to a digital signal originating from the signal source 210.

What is claimed is:

1. A method of pulse mode driving of a semiconductor laser wherein the laser emits laser-light when a current larger than a laser-threshold current passes through the laser, the method comprising: generating a pulsed pedestal current lower than the laser-threshold current, generating information current pulses such that the sum of the pedestal current and the information current during said information current pulses is greater than said laser-threshold current, and passing the pedestal current pulses and information current pulses simultaneously through said semiconductor laser, said pedestal current pulse being switched on prior to a start of an information current pulse, said pedestal current pulse having a pulse length such that it lasts at least until the end of said information current pulse.

2. A method as claimed in claim 8 wherein the pedestal current pulse is switched on gradually.

3. A method as claimed in claim 1, wherein the pedestal current pulse is switched off gradually.

4. A driving device for a semiconductor laser wherein the laser emits laser light when a current greater than a laser-threshold current passes through the laser, said device comprising: first and second switchable current sources coupled in parallel to said semiconductor laser with the first switchable current source arranged to supply a pedestal current to said laser which is lower than said laser threshold current, the second switchable current source being arranged to supply information current pulses to said laser such that the sum of the pedestal current and the information current pulses exceed said laser threshold current, first and second pulse shapers connected to said first and second switchable current sources, respectively, a signal source coupled to said first and second pulse shapers so that the first and second pulse shapers generate first and second switching pulses to switch the first and second current sources, respectively, in response to a pulse originating from the signal source, wherein the first and second pulse shapers are further arranged such that commencement of the second switching pulse is delayed with respect to commencement of the first switching pulse and the lenth of the first switching pulse is at least equal to the sum of the length of the second switching pulse and the length of a time interval between the commencement of the two switching pulses.

5. A driving device as claimed in claim 4 wherein the first current source is switched on gradually.

6. A driving device as claimed in claim 4 wherein the first current course can be switched off gradually.

7. A driving device as claimed in claim 4 characterized in that at least one current source comprises a capacitor.

8. A driving device as claimed in claims 5 or 6 wherein at least one of said current sources comprises a capacitor.

9. A laser-writing apparatus comprising a semiconductor laser, an optical system for focusing laser radiation generated by the semiconductor laser to a radiation spot on a radiation-sensitive surface of an optical record carrier, means for moving the radiation spot and the radiation-sensitive surface with respect to each other, and a pulse-mode driving device as claimed in any one of claims 10, 4, 5, or 6 coupled to drive the semiconductor laser.

10. A pulse-mode drive device for a semiconductor laser that emits laser light when it receives a current greater than a laser-threshold current level, said device comprising:

a source of signal information, first and second current sources, switching means for selectively coupling said first and second current sources to the semiconductor laser, said first current source supplying a pedestal current for said semiconductor laser which is lower than said laser-threshold current level, said second current source supplying an information current of a level whereby the sum of the pedestal current and the information current exceeds said laser-threshold current level, and delay means coupling said signal source to said switching means so as to selectively switch said first and second current sources to the semiconductor laser such that the second current source supplies a current pulse to the semiconductor laser that is delayed relative to commencement of a current pulse supplied to the semiconductor laser from the first current source.

11. A drive device as claimed in claim 10 wherein said delay means comprise pulse shaping means for producing first and second switching pulses for said switching means with the second switching pulse delayed relative to the first switching pulse and wherein the length of the first switching pulse is at least equal to the sum of the length of the second switching pulse and the length of a time interval between commencement of the two switching pulses.

12. A device as claimed in claim 10 wherein said first and second current sources comprise first and second capacitors, respectively, DC coupled to a source of supply voltage.

* * * * *